United States Patent [19]
Kadoiwa et al.

[11] Patent Number: 5,711,813
[45] Date of Patent: Jan. 27, 1998

[54] EPITAXIAL CRYSTAL GROWTH APPARATUS

[75] Inventors: Kaoru Kadoiwa; Takuji Sonoda, both of Itami, Japan

[73] Assignee: Mitsubishi Denki Kabushiki Kaisha, Tokyo, Japan

[21] Appl. No.: 532,283

[22] Filed: Sep. 22, 1995

[30] Foreign Application Priority Data

Sep. 29, 1994 [JP] Japan ................. 6-235020

[51] Int. Cl.$^6$ ........................... C23C 16/00
[52] U.S. Cl. .................. 118/723 VE; 118/715; 118/719; 118/726
[58] Field of Search ................ 117/86, 89, 92, 117/93; 118/719, 723 VE, 723 EB, 715, 726; 417/364, 397

[56] References Cited

U.S. PATENT DOCUMENTS

| | | | |
|---|---|---|---|
| 153,296 | 7/1874 | Atkinson | 417/397 |
| 3,980,044 | 9/1976 | Zollinger | 118/723 VE |
| 4,403,474 | 9/1983 | Ruthven | 60/396 |
| 4,776,166 | 10/1988 | Dixon | 60/595 |
| 4,805,555 | 2/1989 | Itoh | 118/719 |
| 4,824,518 | 4/1989 | Hayakawa et al. | 156/613 |
| 5,007,372 | 4/1991 | Hattori et al. | 118/715 |
| 5,094,596 | 3/1992 | Erwin et al. | 417/397 |
| 5,199,994 | 4/1993 | Aoki | 118/724 |
| 5,350,453 | 9/1994 | Schlosser | 118/719 |
| 5,421,890 | 6/1995 | Kita et al. | 118/719 |
| 5,423,914 | 6/1995 | Nakamura et al. | 118/719 |
| 5,476,811 | 12/1995 | Fujii et al. | 432/105 |
| 5,556,472 | 9/1996 | Nakamura et al. | 118/719 |
| 5,607,511 | 3/1997 | Meyerson | 118/725 |
| 5,622,918 | 4/1997 | Nakamura | 505/473 |

FOREIGN PATENT DOCUMENTS

| | | | |
|---|---|---|---|
| 56-38586 | 4/1981 | Japan | 417/364 |
| 58-91625 | 5/1983 | Japan | 118/726 |
| 59-200758 | 11/1984 | Japan | 118/723 VE |
| 60242989 | 10/1986 | Japan . | |
| 61242988 | 10/1986 | Japan . | |
| 63-224321 | 9/1988 | Japan | 118/726 |
| 63248796 | 10/1988 | Japan . | |
| 3146403 | 6/1991 | Japan . | |
| 5-78191 | 3/1993 | Japan | 118/726 |

OTHER PUBLICATIONS

Tsang, "From Chemical Vapor Epitaxy to Chemical Beam Epitaxy", Journal of Crystal Growth, vol. 95, 1989, pp. 121–123.

Petroff et al., "Band Gap Modulation In Two Dimensions By MBE Growth of Tilted Superlattices and Applications to Quantum Confinement Structures", Journal of Crystal Growth, vol. 95, 1989, pp. 260 and 263.

Tsang, "Chemical Beam Epitaxy of $Ga_{0.47} In_{0.53}$ As/InP Quantum Wells and Heterostructure Devices", Journal of Crystal Growth, vol. 81, 1987, pp. 261–263.

*Primary Examiner*—R. Bruce Breneman
*Assistant Examiner*—Jeffrie R. Lund
*Attorney, Agent, or Firm*—Leydig, Voit & Mayer, Ltd.

[57] ABSTRACT

An epitaxial growth apparatus includes a substrate heating member, a growth chamber, a molecular beam source, a nozzle for ejecting a gaseous source material, an exhaust pipe, and a vacuum chamber. When a gate valve is opened between the vacuum chamber and the growth chamber, gas is exhausted from the growth chamber, and the pressure in the growth chamber is rapidly reduced. The transition from a state where the degree of vacuum is low to a state where the degree of vacuum is high is performed rapidly. Therefore, one crystalline growth apparatus is sufficient for freely selecting among growth modes to achieve desired thickness and controllability of the carrier concentration in an epitaxially grown layer. One mode requires selectivity and another mode suppresses dopant concentration for epitaxial growth of layers of an optical device or of a microwave device.

11 Claims, 11 Drawing Sheets

EPITAXIAL CRYSTAL GROWTH APPARATUS

FIELD OF THE INVENTION

The present invention relates to an epitaxial crystal growth apparatus and, more particularly, to an apparatus that is used in fabricating a compound semiconductor crystal which is used mainly as a semiconductor laser material or a super high frequency device material. The apparatus can change growth mode.

BACKGROUND OF THE INVENTION

Figure 7:
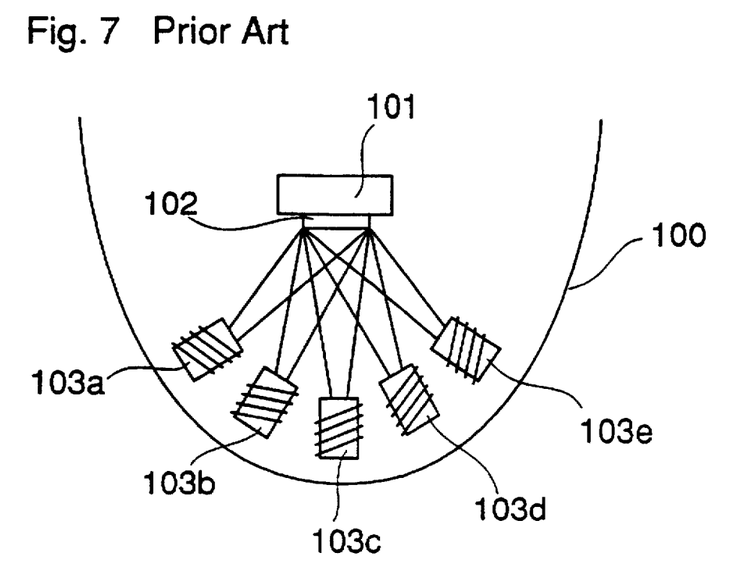
FIG. 7 is a conceptual view illustrating a prior art MBE apparatus.
Figure 8:
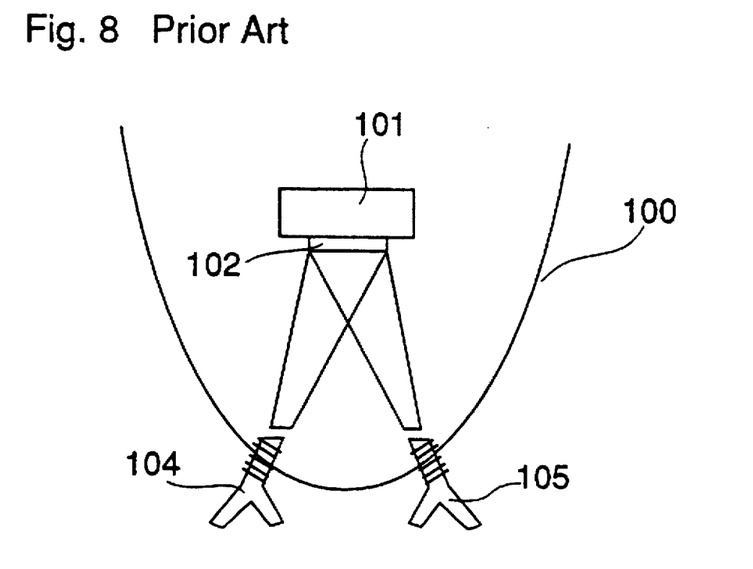
FIG. 8 is a conceptual view illustrating a prior art CBE apparatus.

First of all, a description is given of a prior art crystal growth method for a compound semiconductor. FIG. 7 is a schematic diagram illustrating a prior art molecular beam epitaxy (MBE) apparatus described in Journal of Crystal Growth 95(1989) 121–131. FIG. 8 is a schematic diagram illustrating a prior art chemical beam epitaxy (CBE) apparatus. In FIG. 7, reference numeral 100 designates a growth chamber for performing crystal growth. A substrate heating member 101 is disposed in the growth chamber 100. A substrate 102, such as a GaAs, is disposed on the substrate heating member 101. Cells for containing respective, different solid state materials 103a~103e (hereinafter, referred to as Knudsen cell) are disposed in the growth chamber 100 for outputting molecules of respective materials. In FIG. 8, Knudsen cells 104 for containing AsH$_3$ or PH$_3$ as a Group V element source gas and a cell 105 for containing Group III gas are disposed at the growth chamber 100, respectively.

Figure 9:
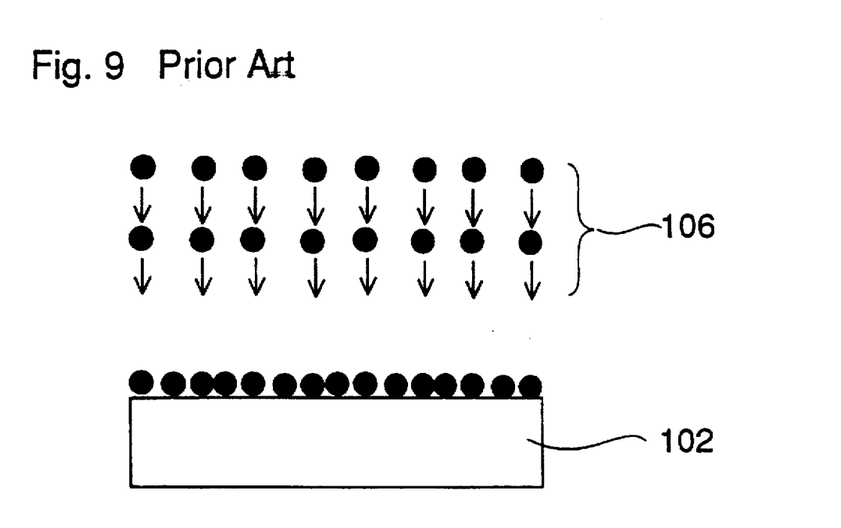
FIG. 9 is a conceptual view illustrating a growth mechanism according to the prior art MBE apparatus.

A description is given of an MBE apparatus. In an MBE apparatus, source material in the Knudsen cell 103 is heated in the growth chamber and held in a high vacuum of $10^{-5}$ Torr, whereby the substrate 106 is irradiated with the material, such as Ga or Al, in a molecular beam, thereby resulting in crystal growth. Then, each cell is set at quite an accurate temperature so that a desired composition ratio and growth speed are obtained. FIG. 9 cited from Journal of Crystal Growth 95(1989)263 is a schematic diagram showing the growth mechanism in the MBE apparatus. In FIG. 9, reference numeral 106 designates molecular beams which are emitted from the Knudsen cells 103a and 103e shown in FIG. 7. Since the mean free path of a molecule is long in such a high vacuum, molecular beams 106 of a Group III element directly reach the surface of the substrate 102 and thereafter, the element enters into a lattice position after moving on the surface of the substrate to some extent to combine with a Group V element. The most significant characteristic of this growth process resides in that since the Group III atom combines with the Group V atom without chemical reactions such as oxidation or reduction in the vicinity of the substrate, the film thickness controllability at the interface increases and whereby a thickness control of subnanomicron order can be achieved, even maintaining a high growth speed, which is appropriate for fine pattern processing. In addition, the MBE apparatus has been employed for mass production of electronic devices, and it has been reported that the crystal growth of a lot of wafers is achieved with high stability and low cost.

Figure 10:
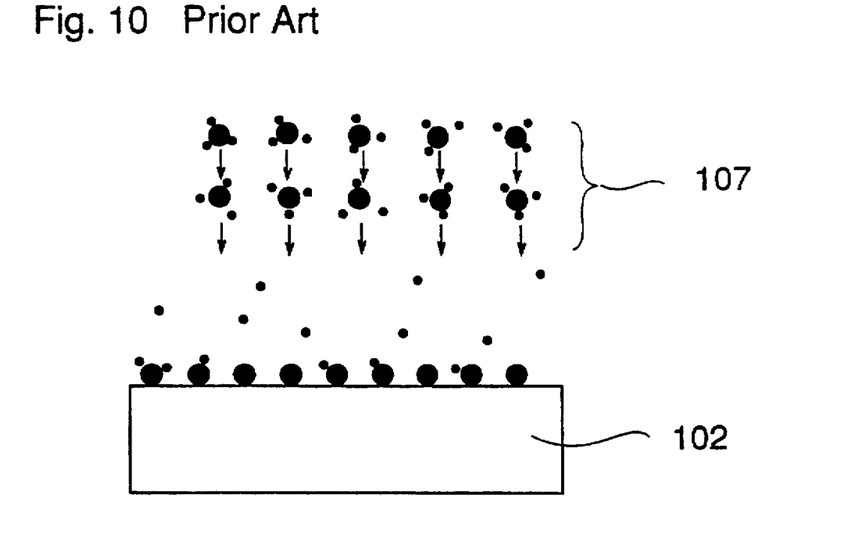
FIG. 10 is a conceptual view illustrating a growth mechanism according to the prior art CBE apparatus.

On the other hand, crystal growth by CBE uses organic metal compound as a Group III element source material as shown in FIG. 8. The organic metal is introduced into a growth chamber 100 held at a vacuum of $10^{-4}$ Torr, it is heated in the gas cell 105, and reaches the substrate 102 heated by the substrate heating member 101. FIG. 10 cited from the Journal of Crystal Growth 95(1989)263 is a schematic diagram showing the vicinity of the substrate during the crystal growth by CBE. In FIG. 10, an organic metal compound beam 107 reaches the substrate 102 accompanied by the alkyl radical, in contrast to the MBE apparatus. The dissolution of the alkyl radical is generated by thermal energy from the substrate heating member 101. In the CBE, there are many choices for the source materials. More particularly, carbon atoms are intentionally added in order to control conductivity type, the incorporation of oxygen is reduced by employing an NH$_2$ compound, an Al source material, or selective growth is performed. In this way, there are quite a lot of variations in the growth.

Figure 11:
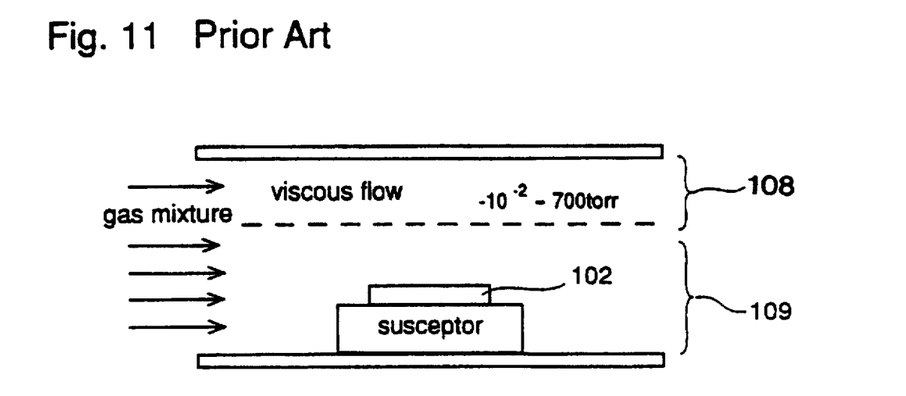
FIG. 11 is a Conceptual view illustrating a prior ark MOCVD apparatus.
Figure 12:
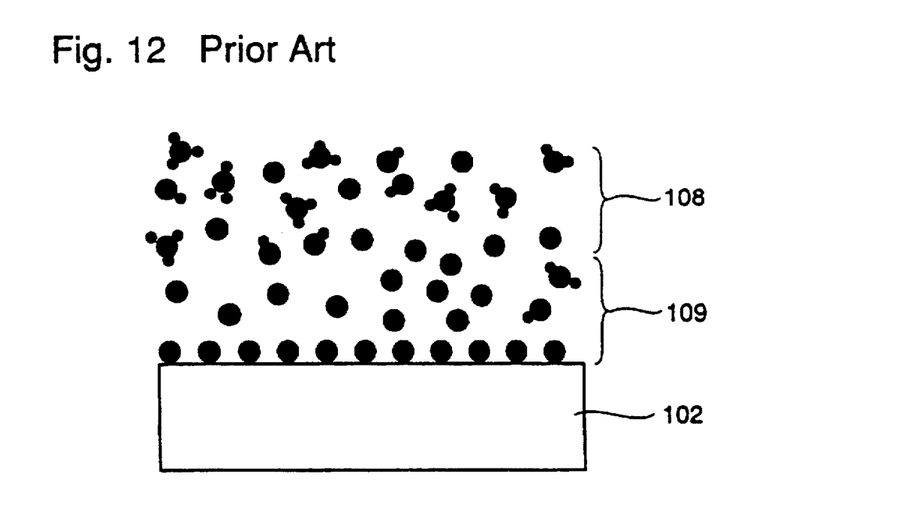
FIG. 12 is a conceptual view illustrating a growth mechanism according to the prior art MOCVD apparatus.

Furthermore, in a case of crystal growth employing metal organic chemical vapor deposition (MOCVD), as shown in FIG. 11, in a state where the pressure in the growth chamber is 760~$10^{-2}$ Torr, AsH$_3$ and PH$_3$ as Group V element source material and the organic metal that is the Group III element source material are supplied simultaneously with H$_2$ serving as a carrier gas. The source material gases are supplied in a viscous flow 108 that is stagnated in the vicinity of the substrate to form a stagnant layer (boundary layer). FIG. 12 cited from the Journal of Crystal Growth 95(1989)263 is a schematic diagram shows a state in the vicinity of the substrate in the MOCVD mode. Unlike crystal growth in the CBE mode, in which the crystal growth is also performed employing an organic metal compound as the Group III element source material, the stagnant layer 109 is formed in the vicinity of the substrate 102, and the alkyl radical is almost decomposed in this stagnant layer 109. Therefore, growth speed is largely influenced not only by the supplied amount of the organic metal compound as the Group III element source material but also by the diffusion speed in the stagnant layer 109 and is inferior in film thickness controllability. In addition, since the ratio of Group V source gas to Group III source gas (V/III ratio) used in the growth is different from that in CBE and MBE by about 100~10 times, there is a disadvantage in consumption of an increased amount of Group V source gas as well as an increased cost. However, even if there is a variation in the substrate temperature, the growth speed hardly changes, and the growth speed can be increased. In addition, since the substrate temperature during the growth is higher than that in CBE and MBE and there is a reduction due to H$_2$ serving as a carrier gas, there is an advantage in that taking in of impurities such as oxygen is less.

Figure 13:
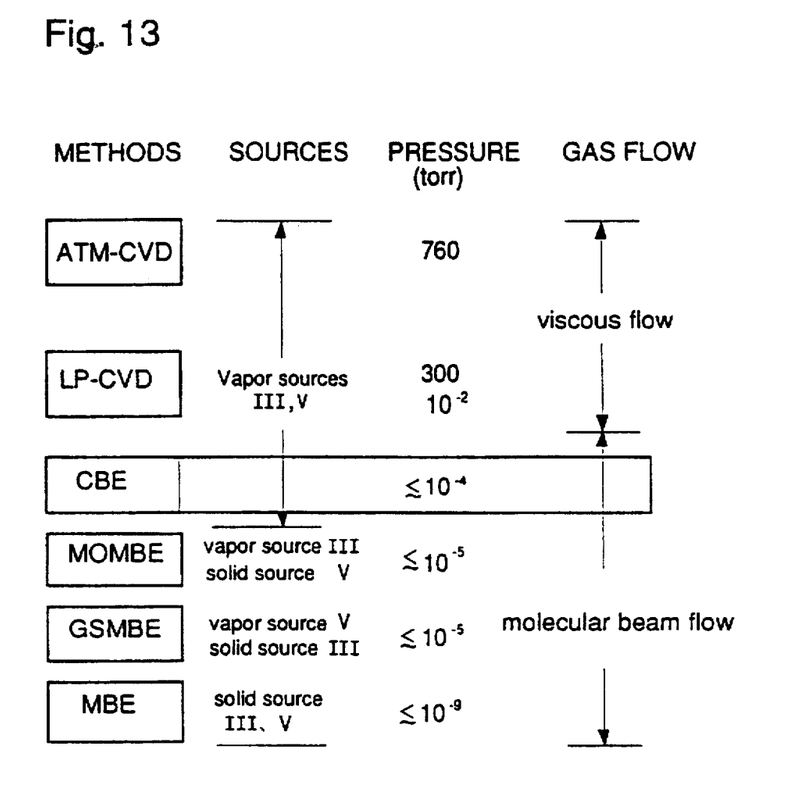
FIG. 13 is a diagram illustrating a relation between crystal growth methods materials pressure, and gas flow.

By the way, there is a large difference in the growth pressures between the above-described MOCVD MBE, and, CBE. This is described by W. T. Tsang in an article entitled "Chemical Vapor Epitaxy to Chemical Beam Epitaxy" in Journal of Crystal Growth 95(1989)123. FIG. 13 shows the relations between the methods, the source materials, the growth pressure, and the gas flow state in the respective crystal growth techniques. Because MOCVD has a growth pressure of 760~$10^{-2}$ Torr, the reaction gas has a viscous flow, as also shown in FIG. 11. On the other hand, CBE and MBE have a growth pressure of less than $10^{-4}$ Torr, and the gas is in a molecular beam region.

As described above, because there is a large difference in the growth pressure between MOCVD MBE, and CBE, it was impossible to realize two or more growth modes, i.e., those where the viscous flow is used and those where the molecular beam region is used in a single growth apparatus. Therefore, it was impossible to realize a growth method utilizing the characteristics of respective fabricating methods, for example, fabricating an active layer for which a fine processing is required employing MBE and CBE and fabricating a current blocking layer placing importance on the growth speed employing the MOCVD, in the fabrication of a laser, which would result in an increased productivity.

Figure 14:
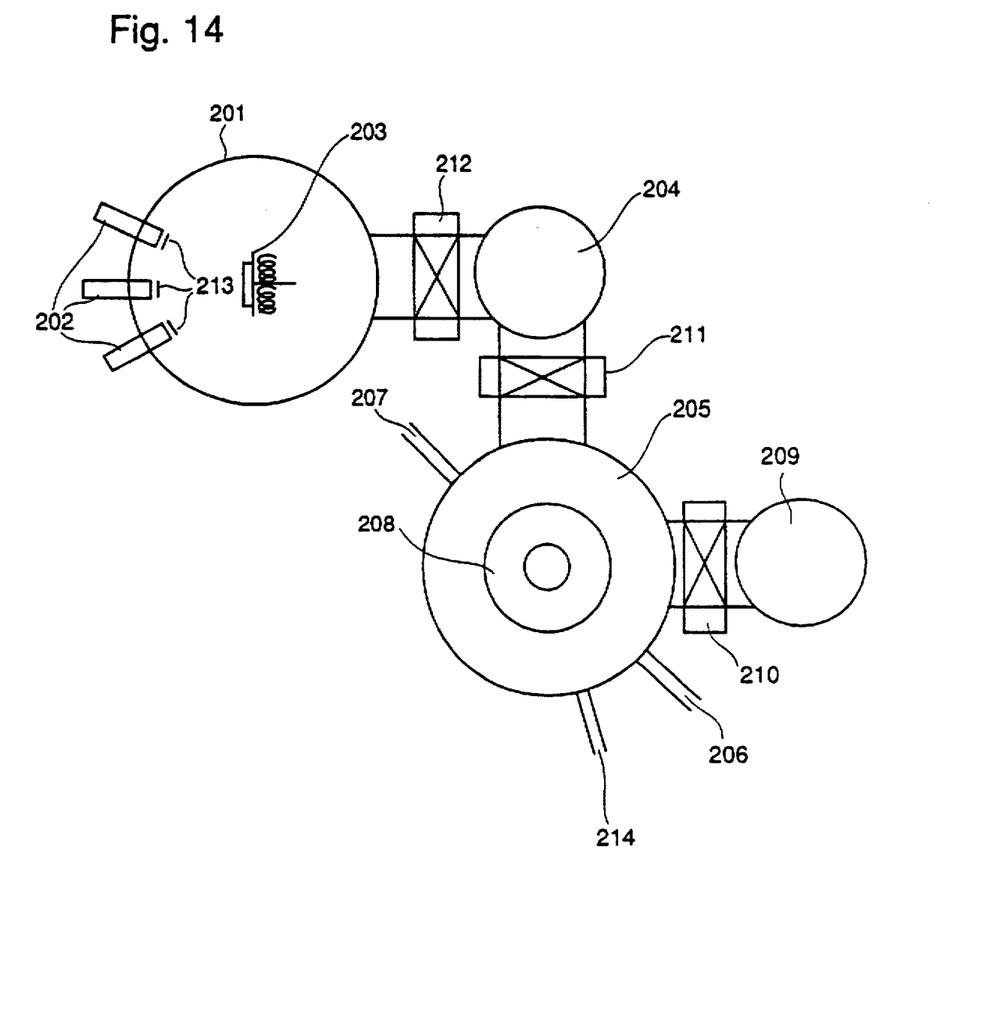
FIG. 14 is a diagram illustrating a prior art linear crystal growth apparatus in which crystal growth mode is changeable.

Japanese Published Patent Application No. 61-242989 discloses a method in which, after performing a vapor phase epitaxial growth, molecular beam crystal growth is performed with a combined vapor phase epitaxial growth chamber and molecular beam crystal growth chamber. FIG. 14 shows a construction of a crystal growth apparatus recited in that Published Application. In FIG. 14, a molecular beam growth chamber 201 has a substrate holder 203 inside, and a plurality of molecular beam cells 202 are provided at the periphery of the substrate holder 203. A shutter 213 for controlling the flow of vaporized molecular beam is provided at the aperture portion of the molecular beam cell 202. A vapor phase epitaxial chamber 205 has a substrate holder 208 inside and inlets 206 and 214 and a gas outlet 207. An inlet port 209 is provided so that a substrate is transferred into the vapor phase epitaxial chamber 205, and an open-close free gate valve 210 is provided between the vapor phase epitaxial chamber 205 and the inlet port 209. An exhaust chamber 204 is provided between the molecular beam crystal growth chamber 201 and the vapor phase epitaxial chamber 205, and both of them are connected with each other via the exhaust chamber 204, and gate valves 212 and 211 respectively arranged between the exhaust chamber 204 and the molecular beam crystal growth chamber 201 and between the exhaust chamber 204 and the vapor phase epitaxial chamber 205.

A description is given of a crystal growth employing such an apparatus. First of all, a rinsed and dried substrate is placed in the inlet port 209, and disposed in the vapor phase epitaxial chamber 205 employing a transfer apparatus not shown in the figure. Then, reactive gas is supplied from the gas inlets 206 and 214 with the gate valves 210 and 211 closed, and by changing the flow rate of the gas, the substrate is alternately subjected to etching or the epitaxial growth. Then, gate valve 211 is opened with the gate valve 212 is closed, and the substrate is introduced into the exhaust chamber 204 and the gate valve 211 is closed. In this state, the exhaust chamber 204 is highly evacuated, and thereafter, the gate valve 212 is opened and the substrate is introduced into the molecular beam crystal growth chamber 201, and the gate valve 212 is closed. Then, a molecular beam crystal growth is performed.

By employing such an apparatus, it is possible to, after removing contamination from of the substrate in the vapor phase epitaxial chamber, perform epitaxial growth, and subsequently perform the molecular beam crystal growth without exposing the substrate to air, thereby reducing the surface defects and obtaining a good quality epitaxial layer. However, because arsenic atoms are actually exuded from the substrate at a high temperature, it is regarded as desirable, after performing the crystal growth with MOCVD, to transfer the substrate into the chamber in a state where the temperature of the molecular beam crystal growth chamber 201 is decreased. Therefore, it was impossible to successively deposit desired semiconductor layers, and the crystal interfaces may be contaminated with such impurities attached to the surface of the substrate during the transfer of the substrate, resulting in possible problems.

The prior art epitaxial crystal growth apparatus is constructed as described above and it is possible to perform a molecular beam crystal growth subsequent to the vapor phase epitaxial growth. However, because the respective apparatus are simply connected with each other when the growth is performed in a plurality of modes, required apparatus must be combined, resulting in a large apparatus, and increased maintenance work. In addition, it was impossible to successively deposit desired layers without a time delay between depositing respective layers.

SUMMARY OF THE INVENTION

It is an object of the present invention to provide an epitaxial crystal growth apparatus that can perform crystal growth by switching a plurality of growth modes.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an epitaxial crystal growth apparatus comprises a substrate heating member mounting a substrate thereon and capable of heating the substrate, a growth chamber for containing the substrate heating member, a molecular beam source fixed to the growth chamber and applying a molecular beam of irradiating crystal growth material to the substrate mounted on the substrate heating member, a nozzle fixed to the growth chamber and ejecting a gaseous crystal growth material to the substrate mounted on the substrate heating member, an exhaust pipe connected to the growth chamber via a gate valve, and a vacuum chamber connected to the growth chamber via the gate valve and containing a vacuum state therein. Since a gate valve is opened between a vacuum chamber and a growth chamber, the vacuum chamber and the growth chamber are made in a communicated state, and the gas is exhausted from the growth chamber and the pressure in the growth chamber is rapidly reduced and the transition from a state where the degree of vacuum is low to a state where the degree of vacuum is high is performed rapidly. Therefore, one crystal growth apparatus is sufficient for corresponding to the growth mode, i.e., mode is freely selected from one corresponding to the thickness and the controllability of the carrier concentration, one requiring the selectivity, and one suppressing the dopant concentration in the crystal, to perform epitaxial growth for the optical device and the microwave device, thereby increasing a performance of the device and reducing cost.

According to a second aspect of the present invention, the epitaxial crystal growth apparatus further comprises a shroud provided along the internal wall of the growth chamber, in which liquid nitrogen is filled, a shroud cover formed so as to cover the shroud with keeping an interval between the shroud and the shroud cover, means for filling a space between the shroud and the shroud cover with the liquid nitrogen, and means for exhausting the filled liquid nitrogen from the space to make the space in a vacuum state. Therefore, the pressure in the growth chamber is reduced by adsorbing a molecule that constitutes a material gas in the growth chamber on the surface of the shroud cover, thereby transferring from a low degree of vacuum to a high degree of vacuum, on the other hand, the pressure in the growth chamber is increased by separating the adsorbed molecule of the material gas from the surface of the shroud cover, thereby transferring from a high degree of vacuum to a low degree of vacuum. Further, with a combination to the above-described construction, the growth mode is rapidly changed.

According to a third aspect of the present invention, in the epitaxial crystal growth apparatus, means for making the space in a vacuum state comprises a first and a second cylinder respectively containing pistons which are connected to opposite ends of an axis, exhaust pipes respectively having valves which respectively communicate a first space and a second space in the first cylinder and a third space and a fourth space in the second cylinder which are partitioned by the pistons, an intake pipe connected to the downstream of the pipe at the side where the liquid nitrogen is exhausted and communicating the first space and the fourth space, an oxygen supplying pipe connected to the second space and the third space and introducing oxygen to the space, and an exhaust pump mechanism connected to the second space and the third space and comprising a pipe supplying phosphine gas that flows through the bent to the space at the crystal growth. Therefore, employing the exhaust pump in which a piston is driven by phosphine gas flown to the bent during crystal growth as a fuel, the liquid nitrogen is rapidly exhausted and evacuated with a low cost and a high driving force, whereby the crystal growth material which has been useless in the prior art crystal growth is effectively utilized.

According to a fourth aspect of the present invention, in the epitaxial crystal growth apparatus, a plurality of rib shaped projections are provided at the surface of the shroud cover to increase an effective surface area of the shroud cover, thereby rapidly changing the growth mode.

According to a fifth aspect of the present invention, in the epitaxial crystal growth apparatus, the vacuum chamber is constructed by connecting a plurality of unit vacuum chambers each having an exhaust pump via gate valves in a multiple of stages. Therefore, the vacuum chambers are successively communicated to a nearer part to the growth chamber, to reduce the pressure in the growth chamber by adjusting gradually and set the pressure to various value, thereby performing the crystal growth on the appropriate growth condition.

DETAILED DESCRIPTION OF THE PREFERRED EMBODIMENTS

Embodiment 1

Figure 1:
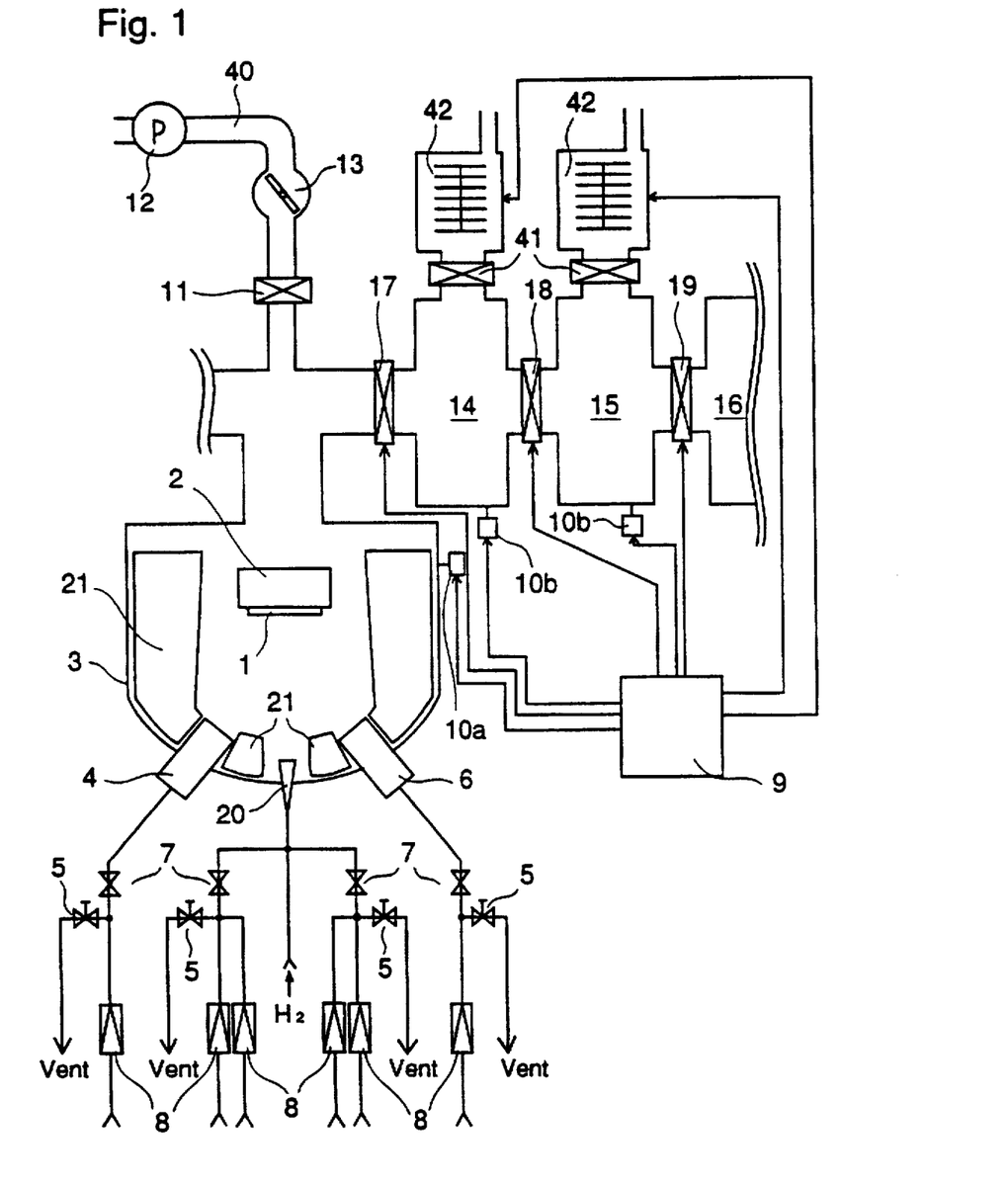
FIG. 1 is a diagram illustrating an epitaxial crystal growth apparatus according to a first embodiment of the present invention.

A description is given of a first embodiment of the present invention. In FIG. 1, reference numeral 1 designates a semiconductor substrate, such as GaAs. A substrate heating member 2 for mounting the substrate 1 is disposed in a growth chamber 3. Shrouds 21, i.e., cryopanels for liquid nitrogen which prevent an impurity gas from contacting the substrate in the heated cell, are disposed in the growth chamber 3. A Group V element source gas cracking cell 4 and a Group III element source gas cracking cell 6 are provided at the growth chamber 3 with ends opened toward the substrate heating member 2. At the other ends of the cells a three way valve 7 is provided. Upstream of each three way valve 7, a mass flow controller 8 and a two way valve 5 are connected. An MOCVD mode injector nozzle 20 is provided at the growth chamber 3 so that one end thereof is opened toward the substrate heating member 2 and other end thereof is divided into three branches, i.e., $H_2$ as a carrier gas is introduced into one of the three branches and the three way valves 7 are connected to the other two branches, and downstream a mass flow controller 8 and a two way valve 5 are connected. A pressure sensor 10a is provided to detect the pressure in the growth chamber 1.

In addition, the growth chamber 3 is provided with an exhaust pipe 40 and a first preliminary vacuum chamber 14 above the substrate heating member 2 and second and third preliminary vacuum chambers 15 and 16, respectively, downstream of the substrate heating member 2. An MOCVD mode exhaust valve 11 that is freely opened and closed is disposed between the exhaust pipe 40 and the growth chamber 3, and a throttle valve 13 and a rotary pump 12 are provided downstream of the valve 11. In addition, a first pressure adjusting gate valve 17 that is freely opened and closed is disposed between the first preliminary vacuum chamber 14 and the growth chamber 3, and second and third pressure adjusting gate valves 18 and 19 are disposed between the first preliminary vacuum chamber 14 and the second preliminary vacuum chamber 15 and between the second preliminary vacuum chamber 15 and the third preliminary vacuum chamber 16, respectively. A turbo molecular pump 42 for exhausting gases is provided in each of the preliminary vacuum chambers 14, 15 and 16 via gate valves 41 (the gate valve 41 and the turbo molecular pump 42 are omitted at the third preliminary vacuum chamber 16 in FIG. 1). Pressure sensors 10b for detecting the pressure in the vacuum chamber are provided in the preliminary vacuum chambers 14, 15, and 16, respectively.

A controller 9 is provided for controlling the pressure adjusting gate valves 17, 18, and 19 and the turbo molecular pumps 42 in accordance with the outputs of the respective pressure sensors 10a and 10b.

A description is given of the method of performing crystal growth employing the epitaxial growth apparatus constructed as above.

First of all, while performing an epitaxial growth employing this apparatus, the pressure adjusting gate valve 17 is closed and the MOCVD mode exhaust valve 11 is opened to make a flow of gas. The source materials are introduced through the mass flow controllers 8, and the gas flow is switched toward the growth chamber from the vent by the three way valves 7. In addition, hydrogen ($H_2$) used as a carrier gas is supplied to the injector nozzle 20. The growth pressure then is made an arbitrary value within in the range of $760~10^{-2}$ Torr by controlling the degree of opening of the throttle valve 13 of the exhaust pipe 40 with the controller 9 on the basis of the signal from the pressure sensor 10a. In other words, when the degree of opening of the throttle valve 13 is small, the pressure in the growth chamber 3 is increased, while when the degree of opening of the throttle valve 13 is large, the pressure in the growth chamber 3 is reduced. Further, during the growth mode, the gate valves 41 of respective vacuum chambers 14, 15, and 16 are opened, the turbo molecular pumps 42 are operated to exhaust the gases in the preliminary vacuum chambers 14, 15, and 16 until the pressure therein becomes a predetermined pressure sensed by the pressure sensor 10b, so as to prepare for crystal growth in the MBE and CBE modes.

During crystal growth in the CBE mode, the material gas and $H_2$ which flow in the MOCVD mode are all stopped and the two way valve 5 is opened and material gas is supplied to the cells 4 and 5. In addition, the MOCVD mode exhaust valve 11 at the exhaust side is closed and respective pressure adjusting valves 17, 18, and 19 are controlled in the degree of opening in accordance with the opening signal from the pressure sensor 10b provided at respective preliminary vacuum chambers 14, 15, and 16 so that the pressure in the growth chamber 3 is $10^{-4}$ Torr. In other words, for example, while when the pressure adjusting gate valve 17 is opened, the pressure in the growth chamber 3 is rapidly reduced, if the pressure detected by the pressure sensor 10b in the first preliminary vacuum chamber 14 does not reach the desired pressure, the pressure adjusting gate valve 19 at the rear stage is opened by the controller 9, and if the pressure reaches the desired pressure, the pressure adjusting gate valve that was formerly opened is closed. The volumes of the preliminary vacuum chambers 14, 15, and 16 are established at the most appropriate values so that a desired degree of vacuum is obtained in the growth chamber 3.

By the above-described operation, the pressure in the growth chamber 3 can be instantaneously reduced to a desired pressure.

In addition, when it is employed in the MBE mode, since the pressure difference in CBE is small as shown in FIG. 13, MBE can be realized by increasing the degree of vacuum by opening many pressure adjusting gate valves. Then, by replacing the Group III element gas cell 6 and the Group V element gas cracking cell 4 with Knudsen cells for respective solid state sources, or providing previously a lot of ports for attaching the cells and attaching the Group III gas cell 6, the Group V element gas cracking cell 4, and Knudsen cells for respective sources, which are required for the growth in respective modes, to the ports, it is not necessary to exchange the cells and it is possible to increase the degree of freedom in operation.

According to this embodiment, an exhaust pipe 40 is provided at the growth chamber 3 via an MOCVD mode exhaust valve 11, the first preliminary vacuum chamber 14 is connected thereto via a pressure adjusting gate valve 17 and a plurality of preliminary vacuum chambers are connected thereto via a pressure adjusting valve at the latter stage thereof. When the growth mode is switched to MBE or CBE from MOCVD, the MOCVD mode exhaust valve 11 is closed and the pressure adjusting gate valve 17 is opened for communication of the growth chamber 3 and the first preliminary vacuum chamber 14 (also a rear stage preliminary vacuum chamber if required), thereby enabling the pressure in the growth chamber 3 to be reduced to a desired pressure instantaneously. In addition, a semiconductor layer that has no turbulence at a crystal interface can be formed. MOCVD, that is superior in the growth speed, and CBE and MBE, that are superior in the fine patterning, can be employed utilizing the characteristics of the respective fabricating methods, thereby enhancing productivity.

Embodiment 2

Figure 2:
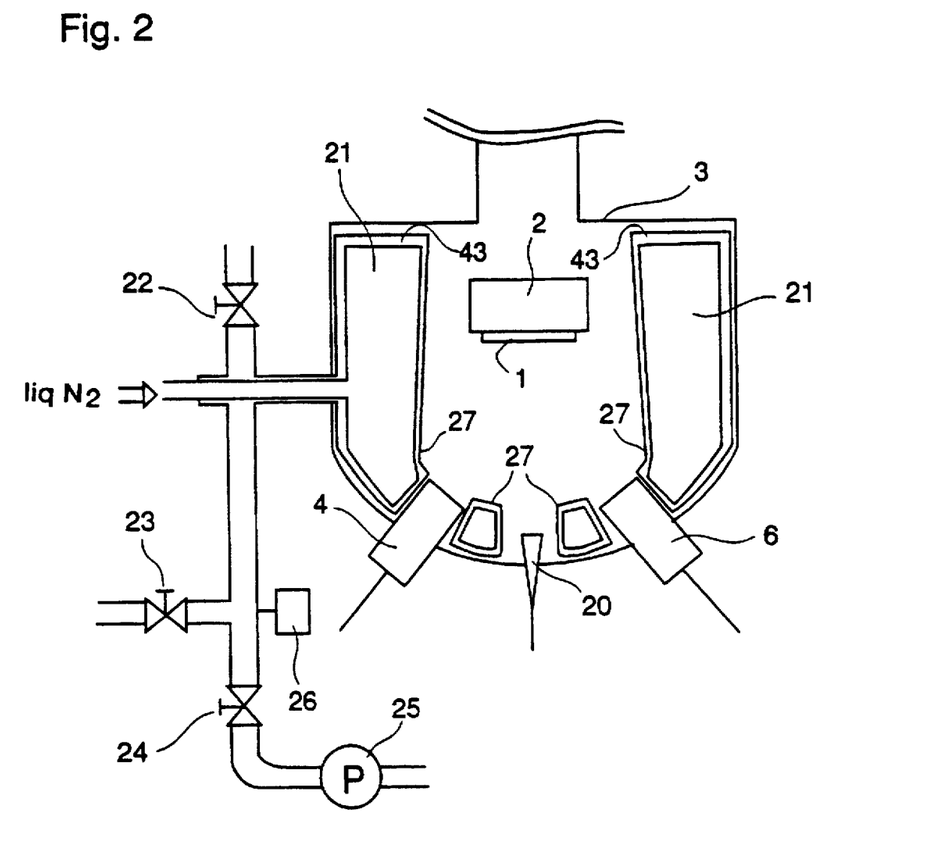
FIG. 2 is a sectional view illustrating a part of an epitaxial crystal growth apparatus according to a second embodiment of the present invention.

A description is given of an epitaxial crystal growth apparatus according to a second embodiment of the present invention. In FIG. 2, the same reference numerals as in FIG. 1 designate the same or corresponding parts. Reference numeral 27 designates a shroud protecting layer (shroud cover) disposed so as to cover the shroud 21. A plurality of rib shaped projections are formed outside the shroud protecting layer 27 and a space 43 having a prescribed width is present between the shroud 21 and the shroud protecting layer 27, as referenced by 27a in FIG. 3. An inlet control valve 22 for liquid nitrogen is connected to the space 43 next to the shroud protecting layer 27 and disposed upstream of the shroud protecting layer 27. An outlet control valve 23 is connected to the space 43 and disposed downstream of the shroud protecting layer 27. A pump inlet valve 24 is disposed downstream of the outlet control valve 23 and an exhaust pipe 25 is disposed downstream of the pump inlet valve 24, and a pressure and temperature sensor 26 is disposed near the outlet control valve 23.

Figure 3:
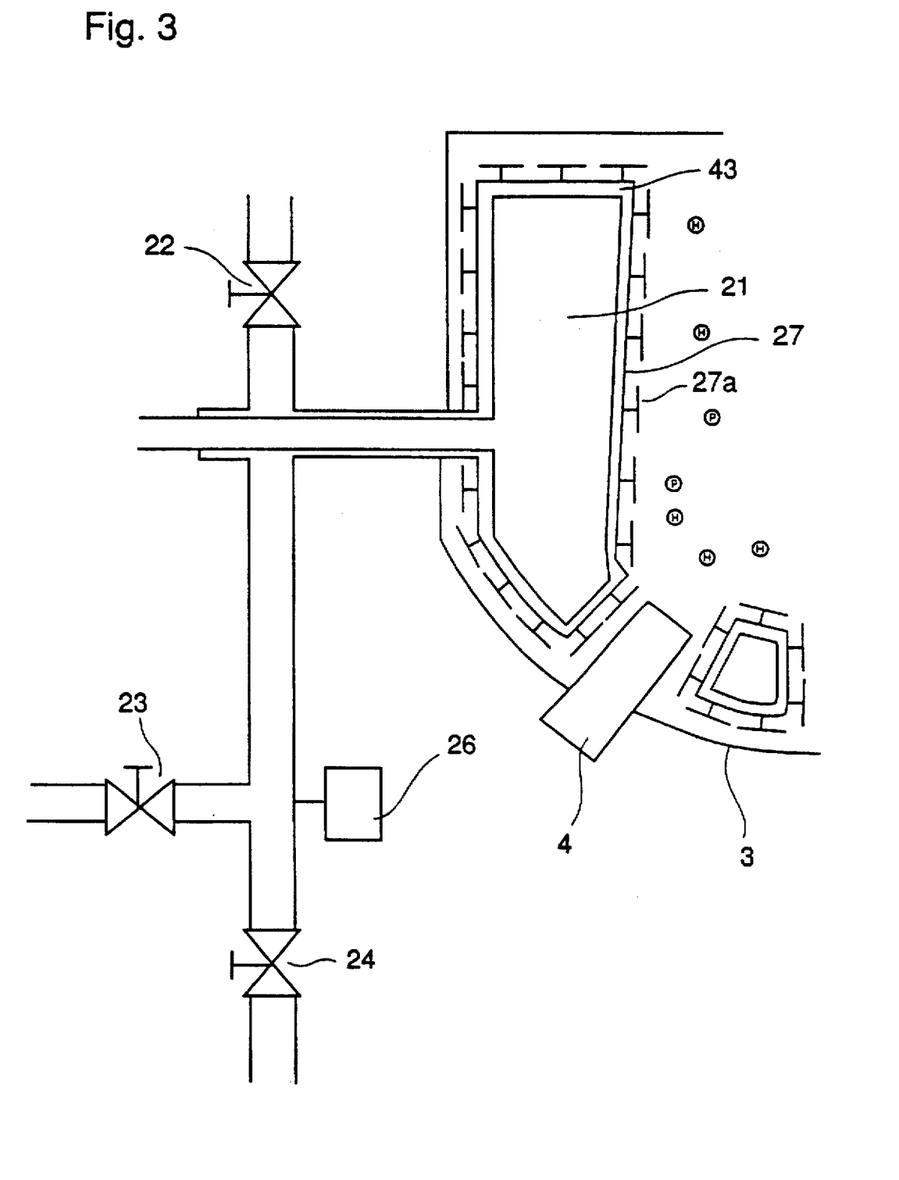
FIG. 3 is a diagram illustrating a periphery of a shroud during crystal growth in an MOCVD mode, employing the epitaxial crystal growth apparatus according to the second embodiment.

Initially, during crystal growth in the MOCVD mode, respective valves are operated as in the first embodiment, the control valves 22 and 23 are closed, the pump inlet valve 24 is opened, and the space 43 between the shroud 21 and the shroud protecting layer 27 is evacuated by the exhaust pump 25. Although the shroud 21 is filled with liquid nitrogen having a low temperature of 77° K., the external surface of the shroud protecting layer 27 is not completely cooled because heat cannot be conducted in a vacuum. Even if the source gas is supplied from an injector nozzle 20 in this state, no source gas adheres to the surface of the shroud protecting layer 27 because the external surface of the shroud protecting layer 27 is at the same high temperature as in the growth chamber 3 as shown in FIG. 3, thereby realizing crystal growth in the MOCVD mode, as in the first embodiment.

Figure 4:
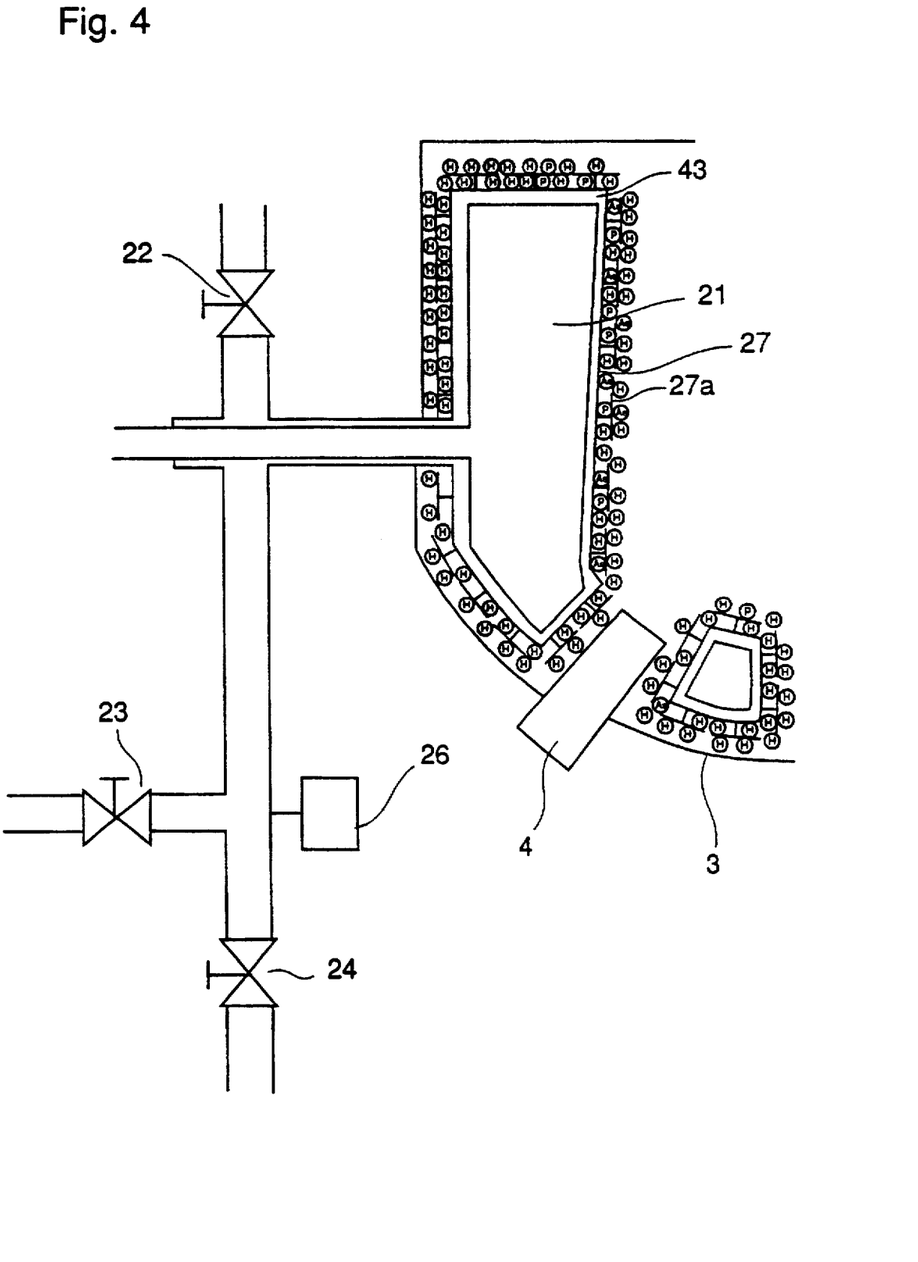
FIG. 4 is a diagram illustrating a periphery of a shroud during changing crystal growth mode from MOCVD to CBE, employing the epitaxial crystal growth apparatus according to the second embodiment.

When the crystal growth is performed by switching the mode from MOCVD to CBE/MBE, it is necessary to instantaneously reduce the pressure in the growth chamber 3. In order to realize that, first of all, respective valves are opened or closed as in the first embodiment, the exhaust pump 25 is stopped, and the control valve 22 is opened so that liquid nitrogen is introduced into the space 43 between the shroud protecting layer 27 and the shroud 21, as shown in FIG. 4. Since the space 43 is in vacuum then, the liquid nitrogen is rapidly introduced into the space 43, thereby filling the space 43 with the liquid nitrogen. When it is detected by the pressure sensor 26 that the pressure in the space 43 has increased to above atmospheric pressure, the exhaust valve 23 is opened, whereby the external surface of the shroud protecting layer 27 is instantaneously cooled to 77° K. Because at this temperature almost all of gases in the growth chamber 3 are adhered, the degree of vacuum in the growth chamber 3 is rapidly increased. By providing a plurality of ribs on the external surface of the shroud protecting layer 27, the quantity of gas that can adhere increases with an increase in a surface area of the shroud protecting layer, thereby further improving the degree of vacuum.

Figure 5:
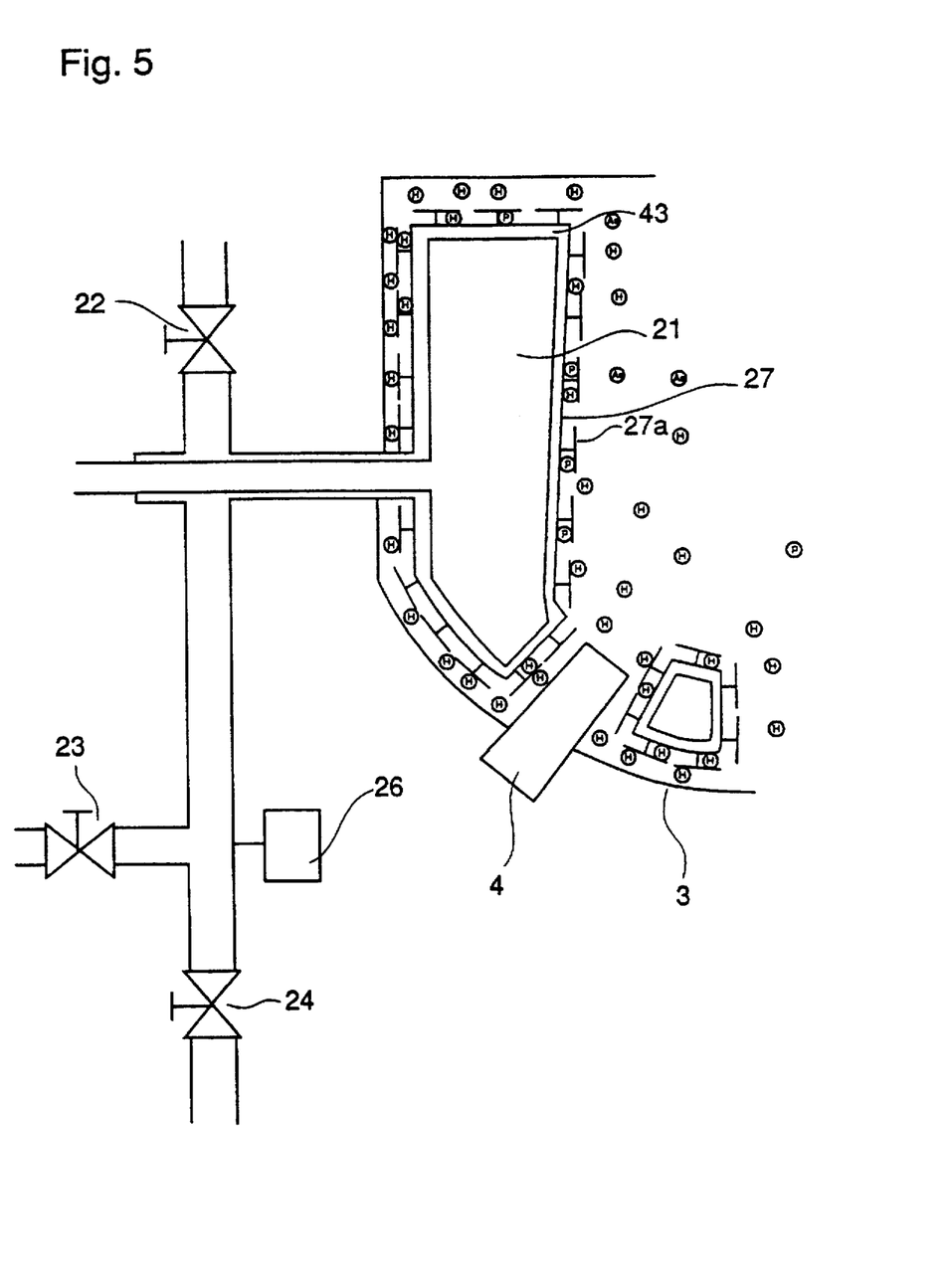
FIG. 5 is a diagram illustrating a periphery of a shroud during changing crystal growth mode from CBE to MOCVD, employing the epitaxial crystal growth apparatus according to the second embodiment.

When the crystal growth is performed by switching the mode from CBE/MBE to MOCVD, the control valve 22 is closed and the supply of liquid nitrogen into the space 43 between the shroud protecting layer 27 and the shroud 21 is stopped. The liquid nitrogen in the space 43 is rapidly evaporated by heat from the cell and the substrate heating part 2 having a high temperature, and it is exhausted from the exhaust valve 23. When the pressure detected by the sensor 26 is reduced to atmospheric pressure, the exhaust valve 23 is closed, the pump inlet valve 24 is opened, the space 43 between the shroud 21 and the shroud protecting layer 27 is evacuated, and the gases which are adhered to the external surface of the shroud protecting layer 27 are desorbed as shown in FIG. 5, upon opening or closing of the valves required in the MOCVD mode conducted. Therefore, the pressure in the growth chamber 3 is rapidly increased to an environment appropriate for crystal growth in the MOCVD mode.

While the shroud protecting layer 27 is of one-layer structure, a multilayer structure may be applied in the present invention, thereby increasing the surface area of the shroud protecting layer with high efficiency.

According to the second embodiment, the shroud 21 is surrounded by the shroud protecting layer 27, the space 43 is formed between the shroud 21 and the shroud protecting layer 27, and the space 43 is filled with liquid nitrogen during switching to the state where the space 43 is evacuated. When the crystal growth is performed by switching the mode from MOCVD to CBE/MBE, the pressure in the growth chamber 3 is rapidly reduced by adsorbing the source gas in the growth chamber 3 on the surface of the shroud protecting layer to increase the degree of vacuum in the growth chamber 3. On the contrary, when the crystal growth is performed by switching the mode from CBE/MBE to MOCVD, the source gas adsorbed on the surface of the shroud protecting layer 27 is desorbed and the pressure in the growth chamber 3 is rapidly increased, whereby the growth apparatus is operated at a higher speed than that in the first embodiment, thereby improving production.

Embodiment 3

Figure 6:
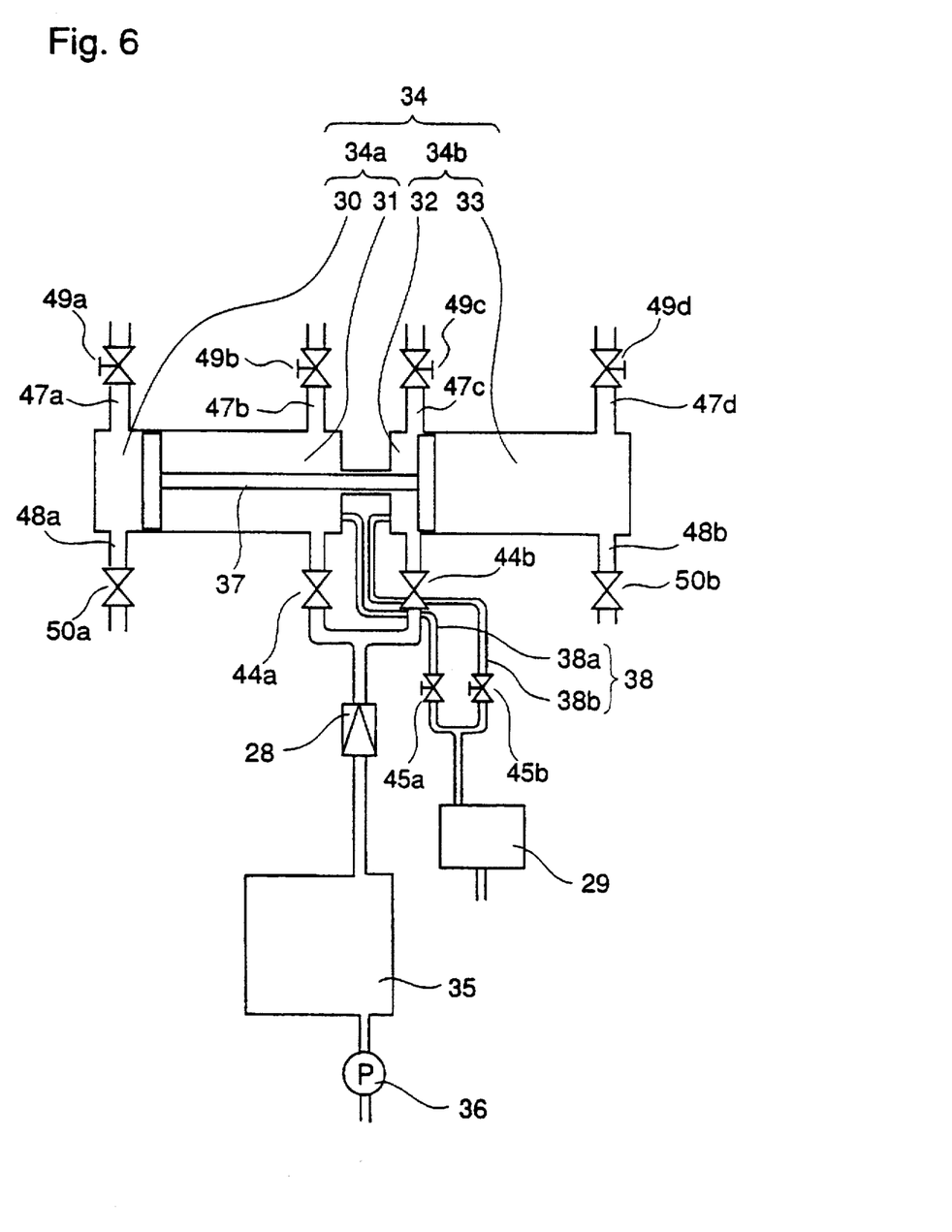
FIG. 6 is a diagram illustrating an exhaust pump of an epitaxial crystal growth apparatus according to a third embodiment of the present invention.

A description is given of an epitaxial crystal growth apparatus according to a third embodiment of the present invention. In order to realize the mechanism described in the second embodiment, a pump having a large displacement is required to evacuate a large quantity of nitrogen in the shroud protecting layer 27 after exhausting the gaseous nitrogen from the exhaust valve 23. In the third embodiment, the following exhaust mechanism is provided. In FIG. 6, reference numeral 34 designates a cylinder connected in place of the pump 25 shown in FIG. 2. This cylinder 34 has two spaces 34a and 34b communicating with each other and through both of which a piston 37 is slidably provided so as to divide the space 34a into a first space 30 and a second space 31 and the space 34b into a third space 32 and a fourth space 33, respectively. A phosphine (PH$_3$) reservoir 35 which is connected to the vent side pipe of PH$_3$ employed as a Group V element source gas for the crystal growth apparatus shown in FIG. 1 is connected to the vent side pipe via a compression pump 36. A controller 28 for controlling the flow rate of PH$_3$ is disposed downstream from the PH$_3$ reservoir 35. The controller 28 divides into two branches that are connected to the second and third spaces 31 and 32 via the gate valves 44a and 44b, respectively. A combustion controller 29, to which oxygen is supplied from the outside, is connected, branched into two, to the second and third spaces 31 and 32 by an oxygen supplying pipe 38 including pipes 38a and 38b connected via the gate valves 45a and 45b, respectively. To the first to fourth spaces 30~33, exhaust ports 47a~47d are connected, respectively, and to the first and fourth spaces 30 and 33, inlet ports 48a and 48b are connected, respectively. These inlet ports 48a and 48b are connected to downstream of the pump inlet valve 24 of FIG. 5 in place of the pump 25 shown in FIG. 2. Reference numerals 49a~49d designate gate valves disposed at the exhaust ports 47a~47d and numerals 50a and 50b designate gate valves disposed at the inlet ports 48a and 48b, respectively.

A description is given of an operation of the exhaust device of the third embodiment. Initially, PH$_3$ gas which flows in the vent line and is thrown away during the crystal growth is introduced into the compression pump 36, and accumulated and compressed in the PH$_3$ reservoir 35. When the first space 30 is reduced to the minimum volume (the first space 30 is in the exhaust stage, the second space 31 is in the expansion stage, and the third space 32 is in the compression stage), oxygen with its flow rate controlled by the combustion controller is injected into the third space 32 simultaneously with the PH$_3$ gas with its flow rate controlled by the controller 28. Further, an explosive reaction of PH$_3$ and oxygen occurs in the third space 32 (the third space 32 is in the expansion stage), the piston 37 moves rapidly toward the right of the space, a lot of gas is taken into the first space 32 (the first space 30 is in the intake stage), and the gas taken in the space is exhausted from the fourth space 33 (the fourth space 33 is in the exhaust stage). When the first space 30 is increased to the maximum volume by ejecting PH$_3$ and oxygen to the second space 31, the gas can be taken into the fourth space 33 and the gas in the first space 30 can be exhausted. Table 1 shows an operation with open-close timing of the respective gate valves.

TABLE 1

| first space | exhaust | intake |
| --- | --- | --- |
| second space | expansion | compression |
| third space | compression | expansion |
| fourth space | intake | exhaust |
| gate valves 49a, 49c | open | close |
| gate valves 49b, 49d | close | open |
| gate valve 50a | close | open |
| gate valve 50b | open | close |

According to the third embodiment, employing the piston 37 having heads at opposite sides of the axle, in the cylinder 34, the space 34a is divided into the first and second spaces 30 and 31 and the space 34b is divided into the third and fourth spaces 32 and 33, by respective heads of the piston 37. The intake-exhaust stage is continued in the first and fourth spaces, and the piston 37 is operated between respective divided spaces in two cycles to exhaust a gas having a volume corresponding to that in the cylinder 34 with every reciprocation of the piston. Therefore, employing the above-described exhaust mechanism, exhaust of the crystal growth apparatus described in the second embodiment is rapidly performed, thereby increasing the pressure in the growth chamber 3. Further, since the driving energy of the exhaust mechanism is provided by using the source gas exhausted at the vent line, the source gas is effectively applied.

What is claimed is:

1. An epitaxial crystal growth apparatus comprising:
 a substrate heating member for mounting of a substrate and for heating the substrate;
 a growth chamber containing the substrate heating member;

a molecular beam source fixed to the growth chamber for applying a molecular beam of crystal growth material to the substrate mounted on the substrate heating member;

a nozzle fixed to the growth chamber for ejecting a gaseous crystal growth material to the substrate mounted on the substrate heating member;

first and second gate valves;

an exhaust pipe connected to the growth chamber via the first gate valve;

a vacuum chamber connected to the growth chamber via the second gate valve;

a shroud located along an internal wall of the growth chamber for receiving a cryogenic liquid;

a shroud cover covering and spaced from the shroud;

means for filling a space between the shroud and the shroud cover with a cryogenic liquid; and means for exhausting the cryogenic liquid from and evacuating the space.

2. The epitaxial crystal growth apparatus of claim 1 wherein the means for exhausting and evacuating comprises:

first and second cylinders respectively containing an axle and first and second pistons connected to opposite ends of the axle;

first, second, third, and fourth exhaust pipes respectively having valves which respectively communicate with a first space and a second space in the first cylinder, the first space and the second space being separated by the first piston, and a third space and a fourth space in the second cylinder, the third space and the fourth space being separated by the second piston;

intake pipes connected upstream of the exhaust pipes where the cryogenic liquid is exhausted and communicating with the first space and the fourth space;

oxygen supplying pipes connected to the second space and the third space for introducing oxygen into the second and third spaces; and an exhaust pump mechanism connected to the second space and the third space and comprising a pipe supplying a gas that flows to the second and third spaces during crystal growth.

3. The epitaxial crystal growth apparatus of claim 2 wherein, in the exhaust pump mechanism, the gas and oxygen react in the second space and the third space respectively so that the pressures in the first, second, third, and fourth spaces vary, the pistons slide in the cylinder to vary the volumes of the first, second, third, and fourth spaces, and gas from the cryogenic liquid taken in from the intake pipes is exhausted from the first, second, third, and fourth exhaust pipes.

4. The epitaxial crystal growth apparatus of claim 1 including a plurality of rib-shaped projections on the shroud cover.

5. The epitaxial crystal growth apparatus of claim 1 wherein the vacuum chamber includes a plurality of connected unit vacuum chambers, each unit vacuum chamber having an exhaust pipe and a gate valve, the unit vacuum chambers being connected in multiple stages.

6. An epitaxial crystal growth apparatus comprising:

a substrate heating member for mounting of a substrate and for heating the substrate;

a growth chamber containing the substrate heating member;

a molecular beam source fixed to the growth chamber for applying a molecular beam of crystal growth material to the substrate mounted on the substrate heating member;

a nozzle fixed to the growth chamber for ejecting a gaseous crystal growth material to the substrate mounted on the substrate heating member;

first and second gate valves;

an exhaust pipe connected to the growth chamber via the first gate valve;

a vacuum chamber connected to the growth chamber via the second gate valve;

a vacuum pump for evacuating the vacuum chamber;

a pressure sensor for sensing pressure in the vacuum chamber; and a controller connected to the pressure sensor and to the second gate valve, the controller, after opening the second gate valve, closing the second gate valve when pressure in the vacuum chamber falls below a threshold pressure.

7. The epitaxial crystal growth apparatus of claim 6 comprising:

a shroud located along an internal wall of the growth chamber for receiving a cryogenic liquid;

a shroud cover covering and spaced from the shroud;

means for filling a space between the shroud and the shroud cover with a cryogenic liquid; and means for exhausting the cryogenic liquid from and evacuating the space.

8. The epitaxial crystal growth apparatus of claim 7 wherein the means for exhausting and evacuating comprises:

first and second cylinders respectively containing an axle and first and second pistons connected to opposite ends of the axle;

first, second, third, and fourth exhaust pipes respectively having valves which respectively communicate with a first space and a second space in the first cylinder, the first space and the second space being separated by the first piston, and a third space and a fourth space in the second cylinder, the third space and the fourth space being separated by the second piston;

intake pipes connected upstream of the exhaust pipes where the cryogenic liquid is exhausted and communicating with the first space and the fourth space;

oxygen supplying pipes connected to the second space and the third space for introducing oxygen into the second and third spaces; and an exhaust pump mechanism connected to the second space and the third space and comprising a pipe supplying a gas that flows to the second and third spaces during crystal growth.

9. The epitaxial crystal growth apparatus of claim 8 wherein, in the exhaust pump mechanism, the gas and oxygen react in the second space and the third space respectively so that the pressures in the first, second, third, and fourth spaces vary so that the pistons slide in the cylinder to vary the volumes of the first, second, third, and fourth spaces and gas from the cryogenic liquid taken in from the intake pipes is exhausted from the first, second, third, and fourth exhaust pipes.

10. The epitaxial crystal growth apparatus of claim 7 including a plurality of rib-shaped projections on the shroud cover.

11. The epitaxial crystal growth apparatus of claim 6 wherein the vacuum chamber includes a plurality of connected unit vacuum chambers, each unit vacuum chamber having a respective exhaust pipe, a pressure sensor, and a gate valve connected to and controlled by the controller, the unit vacuum chambers being connected serially for assisting evacuation of the growth chamber.

* * * * *